United States Patent [19]
Peres et al.

[11] Patent Number: 6,144,674
[45] Date of Patent: Nov. 7, 2000

[54] HITLESS CLOCK RECOVERY IN ATM NETWORKS

[75] Inventors: Mauricio Peres, Kanata; Hojjat Salemi, Nepean, both of Canada

[73] Assignee: Mitel Corporation, Kanata, Canada

[21] Appl. No.: 08/917,101

[22] Filed: Aug. 25, 1997

[30] Foreign Application Priority Data

Aug. 23, 1996 [CA] Canada ................................. 2184013

[51] Int. Cl.[7] .............................. H04J 3/06; H04L 12/56; H04L 7/04
[52] U.S. Cl. ........................ 370/516; 370/395; 375/362; 375/376
[58] Field of Search ..................... 370/503, 465, 370/395, 516, 466; 375/354, 362, 327, 373, 328, 294, 366, 376, 374, 375; 331/2

[56] References Cited

U.S. PATENT DOCUMENTS

| | | | |
|---|---|---|---|
| 4,972,442 | 11/1990 | Steierman . | |
| 5,184,350 | 2/1993 | Dara | 370/466 |
| 5,249,206 | 9/1993 | Applebaum et al. | 375/356 |
| 5,260,978 | 11/1993 | Fleischer et al. | 375/354 |
| 5,260,979 | 11/1993 | Parket et al. | 375/366 |
| 5,572,167 | 11/1996 | Alder et al. | 331/2 |
| 5,596,300 | 1/1997 | Dietrich . | |
| 5,694,397 | 12/1997 | Burton | 370/516 |
| 5,822,383 | 10/1998 | Muntz et al. | 375/362 |

FOREIGN PATENT DOCUMENTS 0517431  5/1992  European Pat. Off. .
2282719  4/1995  United Kingdom .

OTHER PUBLICATIONS

Lau R C et al: Synchronous Techniques for Timing Recovery in Bison IEEE Transactions On Communications, vol. 43, No. 2/04, Part 03, Feb. 1, 1995, pp. 1810–1818. XP000505653 p. 1810, Col. 2, Line 25, p. 1811, col. 1, line 11; p. 1811, col. 2, alinea IV; p. 1817, col. 2, line 28; p. 1818, col. 1, line 3.

Kazuo Yamaguchi et al: Asynchronous Transfer Mode (ATM) Transport Systems Based on High–Speed Optical Transmission Technologies Fujitsu–Scientific And Technical Journal, vol. 30, No. 2, Dec. 1, 1994, pp. 203–212, XP000504492; p. 204, col. 2, alinea 2.2; p. 205, col. 2.

JAPIO abstract of Japanese Patent specification JP 9064732 (Toshiba) Jul. 3, 1997 see abstract.

JAPIO abstract of Japanese Patent specification JP 5083238 (FUJITSU) Feb. 4, 1993 see Abstract.

*Primary Examiner*—Hassan Kizou
*Assistant Examiner*—John Pezzlo
*Attorney, Agent, or Firm*—Marks & Clerk

[57] ABSTRACT

A method of generating timing signals for constant bit rate data received over an asynchronous data network carrying, comprises recovering clock signals from at least two separate sources, selecting one of the sources to drive a phase-locked loop generating a high speed output signal locked to the selected source, dividing the high speed output signal to provide the required timing signals for said constant bit rate data, and continually monitoring the selected source. In the event of failure of the selected source, the phase-locked loop is allowed to free run in a hold-over mode while it is switched over to the other source.

18 Claims, 2 Drawing Sheets

HITLESS CLOCK RECOVERY IN ATM NETWORKS

BACKGROUND OF THE INVENTION

This invention relates to a method of recovering timing signals over asynchronous data networks, such as ATM networks (Asynchronous Transfer Mode), and especially for use with a synchronous TDM backplane, such as a Serial-Telecom bus (ST-BUS).

Asynchronous data networks are capable of offering constant bit rate services (CBR) for carrying time sensitive data, such as video and voice. For this purpose, clock signals must be recovered from the asynchronous network in order to ensure proper timing of the received signals. For example, in the case of PBX with an ST-bus trunked over an asynchronous network with a remote PBX also having an ST-bus, the ST-buses of the two PBXs must be synchronized with one the master and the other the slave.

The ITU (International telecommunications Union) has defined two ways of transporting timing across ATM networks: SRTS (Synchronous Residual Timestamp) and Adaptive method. Both are documented in the I.363 specification available from the ITU, the contents of which are herein incorporated by reference.

To guard against the loss of timing signals, it is generally desirable to have two sources of timing signal in the asynchronous network so that in the event of failure of one source, the system can switch to the other. Such switching usually results in a phase jump, which can momentarily interrupt a telephone conversation, and in the case of a data transmission, for example, fax transmission, result in data loss.

This problem is particularly acute in the case of simultaneous networking of multiple 64 kbps channels available on a Mitel ST-BUS backplane across an asynchronous data network, such as ATM. The Mitel ST-BUS backplane is a multi-serial stream bus whereby a plurality of 64 kbps TDM channels are transported with reference to an 8 kHz reference signal (F0) and CKx2 and CKx1 clocks respectively.

In the ST-BUS interface, channel zero on all the serial streams is aligned with the F0 synchronization pulse. Three different data rates are provided in the ST-BUS. These are 2.048, 4.096 and 8.192 Mbps rates. For all the three rate modes, CKx1 signal carries the bit rate of the specified mode and CKx2 carries twice as the data rate. As an example, if the ST-BUS backplane is operated at 8.192 Mbps, then CKx2 signal is at 16.384 MHz. The term common bit clock refers to signal CKx1.

In the case of the simultaneous transport of ST-BUS channels across an ATM network, the precise and continuous generation of timing signals is especially important to ensure quality of transmission and avoid loss of data. To achieve the function required, the source 2.048 MHz clock from the ST-BUS backplane has to be recovered at the other end with the same precision as the source.

An object of the invention is to meet this objective.

According to the present invention there is provided a method of generating timing signals for constant bit rate data received over an asynchronous data network, comprising the steps of recovering clock signals from at least two separate sources; selecting one of said sources to drive a phase-locked loop generating a high speed output signal locked to said selected source; dividing said high speed output signal to provide the required timing signals for said constant bit rate data; continually monitoring said selected source and in the event of failure thereof, switching over to said other source while allowing said phase-locked loop to free run in a hold-over mode during the switch over from one said source to the other.

In the "hold-over" mode, the phase-locked loop tracks an internal oscillator to maintain the output in synchronization with the reference signal as it was immediately prior to loss of synchronization until a new reference signal becomes avaiable.

The phase-locked loop runs at a frequency which is a multiple of the actual timing signals. For example, the PLL may generate a stable signal at 16 Mhz, which is divided by, 4, 8, and 2048 to derive CLKx2 (4 MHz), CLKx1 (2 MHz) and the ST-bus F0 (8 KHz) respectively.

The invention allows the user to recover a common bit clock from the asynchronous network, which drives all the serial streams of an ST-BUS synchronous interface from a primary or secondary reference, each associated with a separate ATM Virtual Circuit. If the primary source of clock fails, the invention ensures a hitless clock switch-over to the secondary reference.

This invention thus provides the emulation of any 64 or N×64 kbps channels or circuit across an ATM network. The N×64 kbps channels can be located anywhere over the multiple ST-BUS lines, forming a "groomed" channel. For the transmission and recovery of the ST-BUS common bit clock (CKx1) at the remote station, either ATM AAL 1 Adaptive or Sychronous Residual Time Stamp (SRTS) methods suggested by the ITU (I.363 is recommended) can be used.

By using the described hitless clock switch-over mechanism, the user can dynamically program or change the clock recovery mechanism from Adaptive to SRTS and vice-versa, on a per ATM VC (Virtual Circuit) basis.

An important advantage of the invention is that, at the receive end, once the common bit clock is recovered, the 64 or n×64 kbps channels are emulated and placed over an ST-BUS backplane with its integrity protected. The ST-bus F0 (8 KHz) reference phase does not change during clock switch over.

The invention allows the use of off-the shelf PLLs (Phase-Locked Loops) and digital logic to regenerate the ST-BUS CKx1 clock without incurring phase jumps. The TDM clock logic also allows the user to manually change from one time reference to another without corrupting the ST-BUS clock (i.e. hitless operation).

The invention thus permits channelized N×64 ST-BUS trunking over an ATM network by emulating the ST-BUS 2.048 MHz basic clock (derived from CKx2 input) from source to destination. The recovered common bit clock can be derived from a Primary or Secondary reference. Each reference has a separate ATM Virtual Circuit. If the Primary source of clock fails, the invention provides a hitless clock switch over to the secondary reference.

The 8 KHz reference (REF8KCK) clock is sourced either from a Primary recovered ATM VC clock or from a Secondary one. A monitor circuit is used to check the validity of the incoming SRTS or a timing cell in the case of an adaptive scheme within these VCs. Upon the detection of the synchronization failure or loss of synchronization, the circuit would switch the references. When a failure is detected on the incoming VC source, the external PLL is automatically forced to free run in the hold-ver mode. In this mode the PLL keeps its output frequency fixed and no further corrections are made.

The invention also provides a timing signal generator for use with over an asynchronous data network carrying constant bit rate data, comprising means for recovering clock signals from at least two separate sources over the asynchronous network; a phase-locked loop generating a high speed output signal; means for dividing said high speed output signal to provide the required timing signals for said constant bit rate data; means for selectively connecting either of said sources to said phase-locked loop so that the timing signals recovered therefrom drive said phase-locked loop; and means for continually monitoring one said source connected to said phase-locked loop, said monitoring means connecting the other source to the phase-locked loop in the event of failure of said one source, and said monitoring means further outputting a signal to cause said phase-locked loop to free run in a hold-over mode during the switch-over from one said source to the other.

BRIEF DESCRIPTION OF THE DRAWINGS

The invention will now be described in more detail, by way of example, only with reference to the accompanying drawings, in which.

DESCRIPTION OF THE PREFERRED EMBODIMENTS

Figure 1:
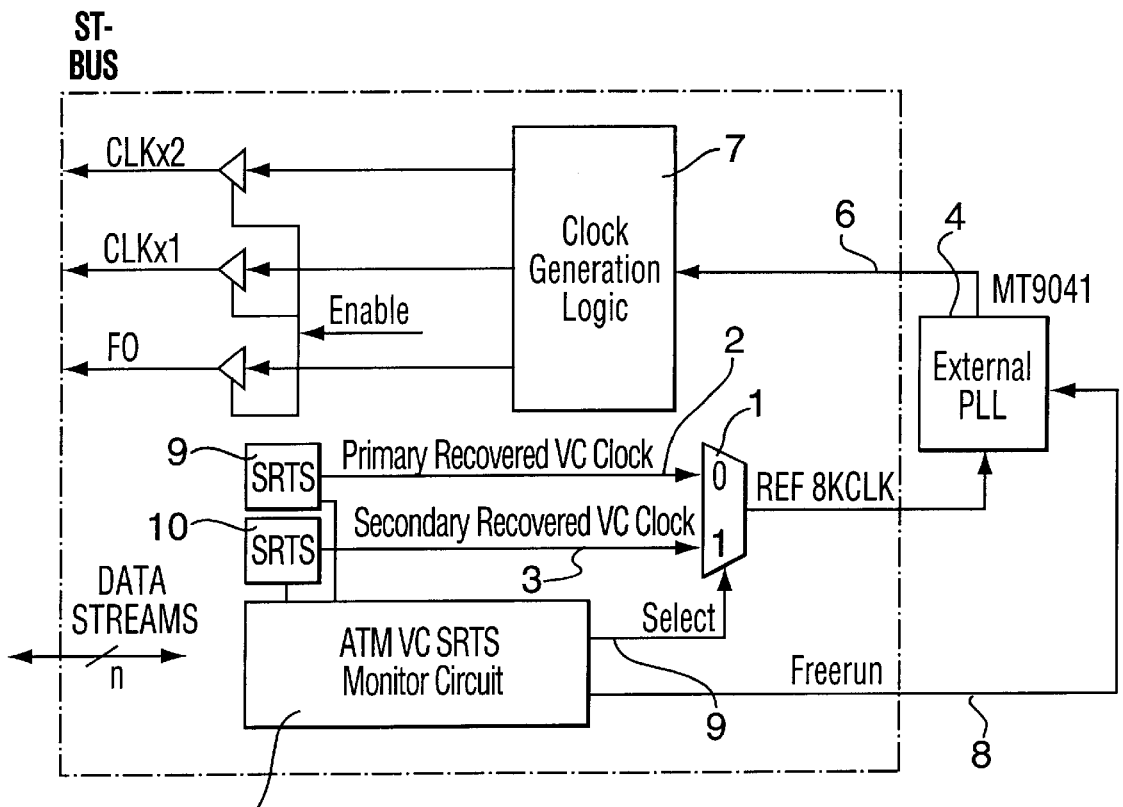
FIG. 1 is a block diagram of a timing signal generator in accordance with the invention.

In FIG. 1, primary and secondary clock signals 2, 3 derived from conventional SRTS clock recovery circuits 9, 10 connected to an ATM network are input to the respective inputs of a gate 1 whose output is connected to the input of a phase-locked loop 4. The clock signals are recovered in clock recovery circuits 9, 10 from virtual connections (VCs) established through the ATM network (not shown) using known techniques, for example, the SRTS or adaptive clock recovery method suggested by the ITU (I.363).

Monitoring circuit 5 continually monitors the integrity of the recovered clock signals. Assuming the primary VC clock 2 is working normally, monitoring circuit selects this source in gate 1 and applies it to the input of the phase-locked loop 4, for example, a Mitel corporation PLL part no. MT9041 and described in U.S. patent application Ser. No. 08/440, 939, the contents of which are herein incorporated by reference. The PLL 4 outputs a stable 16 MHz clock signal 6 to ST-bus clock generation logic circuit 7. This consists of a divider array 7, which divides by 4, 8, and 2048 to derive CLKx2 (4 MHz), CLKx1 (2 MHz) and F0 (8 KHz) respectively for application to an ST-BUS backplane. This PLL also has a hold-over pin that when activated causes the PLL to free run in the hold-over mode as described above.

When the monitoring circuit 5 detects a failure of the primary clock 2, it immediately causes PLL 4 to free run in the hold-over mode via line 8. The monitoring circuit 5 then validates the secondary clock 3. Once secondary clock 3 has been determined as stable, the monitoring circuit removes the hold-over signal 8 and applies the secondary clock 3 through gate 1, whereupon the PLL 4 becomes synchronized to the secondary source 3. The switchover can be implemented automatically by the hardware, or alternatively can be implemented in software under the control of the user.

When the monitoring circuit 5 detects the resumption of timing integrity on the primary clock 2, if required by the application, it switches the PLL 4 back to the primary source 2 using the same technique, i.e. first putting the PLL 4 into the hold-over mode.

In this manner, no phase jump occurs on change-over between clock sources for the ST-bus F0 and timing signal S. The PLL keeps running in the hold-overmode at a high frequency, typically an 8 or 16 Mhz ST-bus clock. Any slight phase change at this frequency has no significant impact on the 8 KHz ST-bus framing signal F0.

The clock generation logic 7 receives, for example, a 16 MHz clock and generates all the clocks which are needed, CLKx2, CLKx1, and F0. This circuit is a simple divider. Since all the ratio a power of 2, the circuit generates 50% duty cycle signals and is very simple to implement.

When a switch from the receive timing reference from one ATM VC to another occurs, the circuit uses a programmable high speed clock, for example at 16 MHz, to generate all the clocks and for this reason the ST-bus F0 phase does not change during switch over. This mechanism guarantees hitless data on the TDM bus while the reference is switched to another source.

Since the TDM data streams on the ST-BUS are synchronized to one clock and a frame sync pulse, the recovered clock for all streams is from one source. For example, a node may receive several Nx64 kbps data from a number of sources, this node can only lock all its clock and data to one of the incoming VCs.

Figures 3, 4:
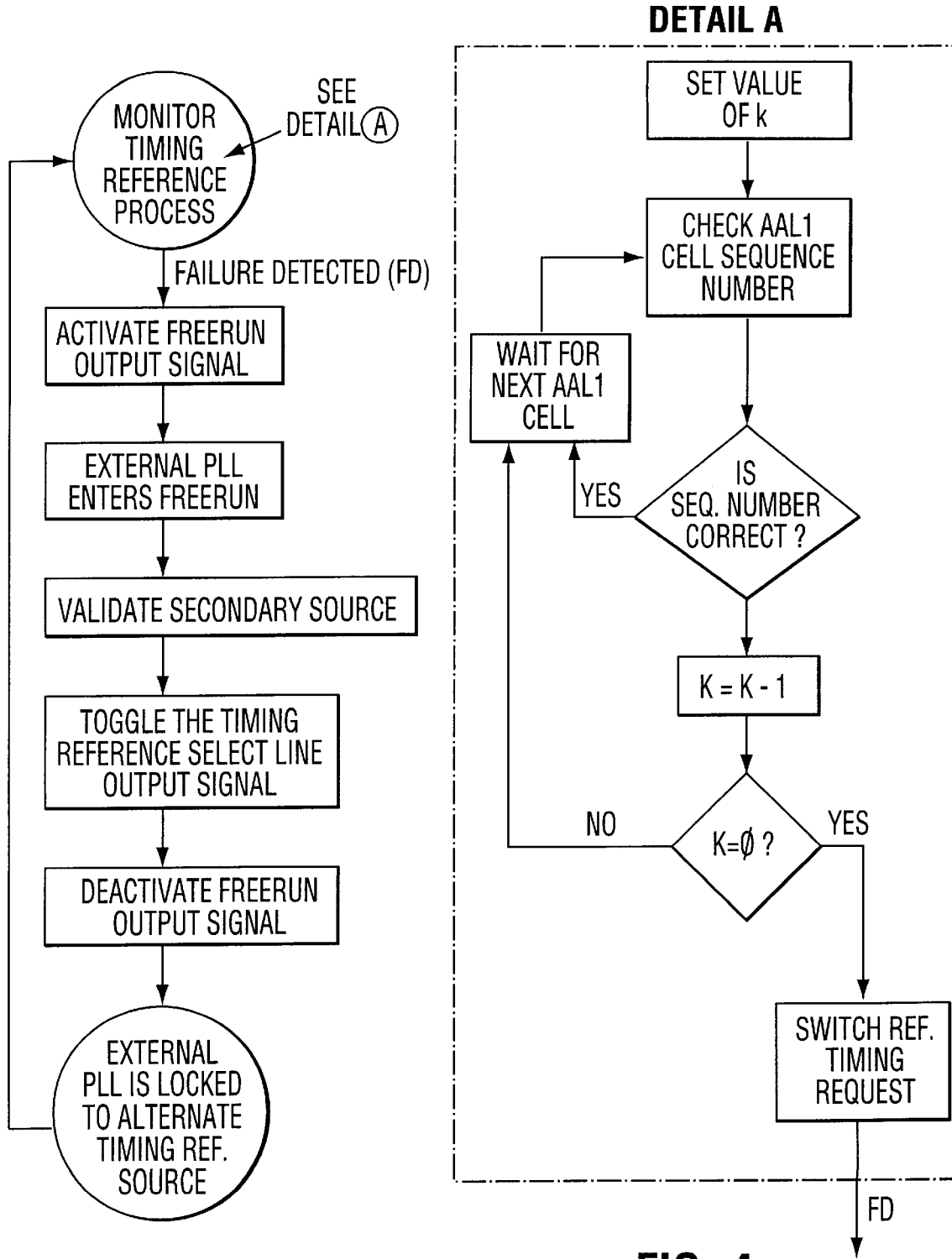
FIG. 3 is a high level flow chart showing the implementation of the invention.
FIG. 4 illustrates a portion of FIG. 2 in more detail.

FIG. 3 is a flow chart describing the implementation of the method. Unit 5 monitors the timing references. When a loss of synchronization failure is detected, monitor circuit 5 activates the output signal on line 8 to put the phase-locked loop 4 into the free-running hold-over mode. While this is happening, unit 5 checks the validity of the secondary clock 3. Assuming this is valid, unit 9 then toggles the timing select line via gate 1. Unit 5 then deactivates the hold-over output signal on line 8 and the PLL 4 becomes locked to the alternate timing reference source. The unit 5 then reverts to the monitoring mode.

The ATM forum and ITU specifications do not define a message service to indicate that AAL-1 source cell switching should occur in the event of an anomaly for both adaptive and SRTS clock recovery methods. Thus, in order to communicate a source timing failure to the unit 5, the transmitting device at the timing source end deliberately corrupts the sequence numbers of a predetermined number of consecutive AAL-1 cells, in this case three.

As ATM AAL-1 cells may get out of sequence during transmission, the cells are sent with a sequence number and associated CRC error check. The receiving device checks the cells on the basis of the sequence number to determine when any anomaly, such as cell loss, has occurred in the ATM network.

It is very unlikely that in a normal situation more than one sequential cell would have an invalid CRC. In the present invention, the sequence numbers of three sequential cells are deliberately changed, or alternatively there CRCs are deliberately corrupted, when the transmitter does not have a valid timing sequence. When the unit 5 detects a sequence of three AAL-1 cells with invalid sequence numbers, it knows that a timing error has occurred at the source and uses this as a trigger to switch timing reference signals in the manner described above. Also, a serious error in the ATM network could cause three or more consecutive cells to get out of sequence, and this circumstance would also properly be interpreted by unit 5 as a timing error.

FIG. 4 shows this process in more detail. The debounce factor k is first set to the agreed value, in this case 3. Next the cell sequence number is checked, and if correct no action is taken. The unit 5 just waits for the next cell.

If the sequence number is incorrect, i.e. its CRC is invalid, k is decremented by 1. The next block then determines whether k=0. If not, the program waits for the next cell and repeats the process. If k=0, this acts as the trigger to cause unit 5 to switch timing reference.

Figure 2:
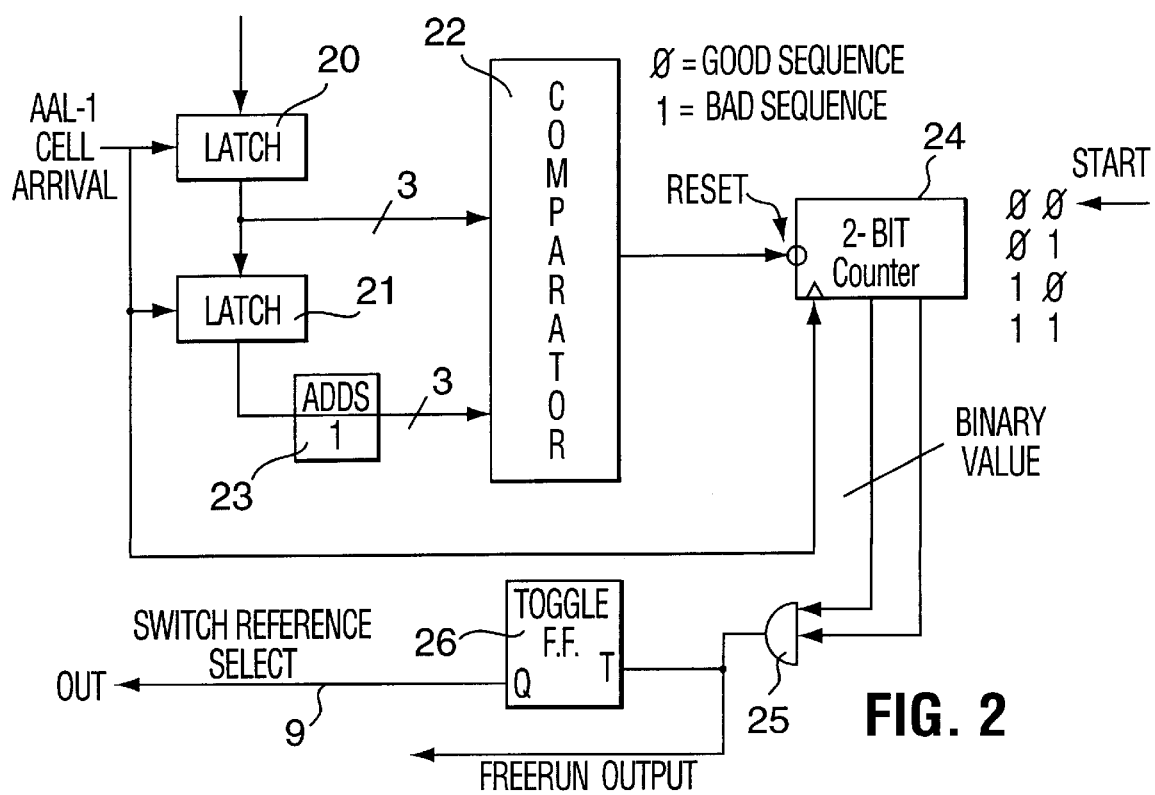
FIG. 2 is a block diagram showing the monitoring circuit in more detail.

The monitoring circuit 5 is shown in more detail in FIG. 2. Incoming AA1-1 cells are sequentially applied to latch 20 and clocked through to the next latch 21 at each AAL-1 cell arrival. The sequence number, which is represented by a 3 bit number, is applied to the comparator 22. Adder 23 adds one to the sequence number of the preceding cell stored in latch 21. If the sequence numbers are sequential, the comparator will note a match and output a zero, otherwise it will output a one. Two bit counter 24 counts the arrival of AAL-1 cells and is reset each time a zero is output by the comparator 22. If three bad sequences occur in succession the binary count in counter 24 will reach 11, whereupon AND gate 25 outputs a one causing bistable flip-flop 26 to output a switching reference signal on line 9.

The invention thus provides continuous timing over an ATM network between, for example, Serial-Telecom bus based PBXs.

The embodiments of the invention in which an exclusive property or privilege is claimed are defined as follows:

1. A method of generating timing signals for constant bit rate data received over an asynchronous data network, comprising the steps of recovering clock signals from at least two separate sources; selecting a first of said sources as providing a reference signal to drive a phase-locked loop generating a high speed output signal synchronized to said reference signal; dividing said high speed output signal to provide the required timing signals for said constant bit rate data; continually monitoring said selected source and in the event of failure thereof placing said phase-locked loop in a free-running hold-over mode wherein said phase-locked loop maintains said high speed output signal in synchronization with said reference signal as said reference signal was immediately prior to failure of said selected source, validating a second of said sources as stable, and when said second of said sources has been determined as stable switching said phase-locked loop over to said second source to provide said reference signal to said phase-locked loop.

2. A method as claimed in claim 1, wherein said clock signals are recovered from separate virtual circuits through the network using an adaptive clock recovery technique.

3. A method as claimed in claim 1, wherein said clock signals are recovered from separate virtual circuits through the network using an SRTS clock recovery technique.

4. A method as claimed in claim 1, wherein said timing signals are applied to an ST-BUS backplane to permit the transfer of ST-BUS trunks over said asynchronous data network.

5. A method as claimed in claim 2, wherein said asynchronous data network is an ATM network.

6. A method as claimed in claim 1, wherein cells transmitted over the asynchronous data network have sequence numbers, said sequence numbers are deliberately corrupted at the transmitting end in the event of a timing error, and the sources are switched upon detection of a predetermined number of cells with invalid sequence numbers.

7. A method as claim 6, wherein the sequence numbers are corrupted by the timing generator source and maintained at the same value for a "user specified" number of cells.

8. A method as claimed in claim 7, wherein said cells are AAL-1 cells.

9. A method as claimed in claim 6, wherein said predetermined number is three.

10. A method as claim 1, wherein failure is detected upon the arrival a predetermined number of consecutive cells having invalid sequence numbers.

11. A timing signal generator for use over an asynchronous data network carrying constant bit rate data, comprising:

first and second clock recovery units for recovering clock signals from at least two separate sources over the asynchronous network;

a phase-locked loop generating a high speed output signal;

divider circuitry for dividing said high speed output signal to provide the required timing signals for said constant bit rate data;

a selector for selectively connecting one of said first and second clock recovery units providing a reference signal to said phase-locked loop so that said reference signal drives said phase-locked loop; and a monitoring circuit for continually monitoring said clock recovery unit connected to said phase-locked loop to detect a failure thereof, said monitoring circuit providing a hold-over signal to the phase-locked loop in the event of failure of said one clock recovery unit to place said phase-locked loop in a hold-over mode wherein said phase-locked loop maintains said high speed output signal in synchronization with said reference signal as said reference signal was immediately prior to failure of said selected clock recovery unit, and said monitoring circuit further validating the reference signal derived from the other of said first and second clock recovery units, and when the reference signal from said other clock recovery unit has been determined as stable said monitoring circuit switching said phase-locked loop over to receive the reference signal from said other clock recovery unit so that said high seed output signal becomes synchronized to said reference signal from said other clock recovery unit.

12. A timing signal generator as claimed in claim 11, wherein said means for recovering clock signals comprises an SRTS clock recovery device.

13. A timing signal generator as claimed in claim 11, wherein said means for recovering clock signals comprises an adaptive clock recovery device.

14. A timing signal generator as claimed in claim 11, wherein said monitoring means monitors the sequence numbers of consecutive arriving cells to determine the presence of a timing integrity failure of the connected source.

15. A timing signal generator as claimed in claim 11, wherein said monitoring means switches sources upon detection of three consecutive cells with three invalid sequence numbers.

16. A timing signal generator as claimed in claim 14 wherein said monitoring means comprises a pair of latches for storing the sequence numbers of sequential cells, an adder for incrementing the sequence number of the earlier cells by one, and comparator for comparing the incremented sequence number with the later arrived cell, and a modulo m counter, where m is an integer, that is incremented on the arrival of a cell with an invalid sequence number and reset on the arrival with a valid sequence number.

17. A method as claimed in claim 1, wherein in said hold-over mode said phase-locked loop tracks an internal oscillator to maintain the output in synchronization with the reference signal as said reference signal was immediately prior to failure of said selected source.

18. A timing generator as claimed in claim 11, wherein in said hold-over mode said phase-locked loop tracks an internal oscillator to maintain the output in synchronization with the reference signal as said reference signal was immediately prior to failure of said selected clock recovery unit.

* * * * *